United States Patent [19]
Lee et al.

[11] Patent Number: 5,348,446
[45] Date of Patent: Sep. 20, 1994

[54] BIMETALLIC TURBINE AIRFOIL

[75] Inventors: Ching-Pang Lee, Cincinnati; Anne M. Isburgh, Loveland; Paul S. Wilson, Sharonville, all of Ohio

[73] Assignee: General Electric Company, Cincinnati, Ohio

[21] Appl. No.: 54,381

[22] Filed: Apr. 28, 1993

[51] Int. Cl.⁵ .............................................. F01D 5/28
[52] U.S. Cl. ........................ 416/241 R; 416/97 R; 29/889.72; 29/889.721; 428/652; 428/680
[58] Field of Search ............... 415/115, 116, 200, 915; 416/95, 96 R, 96 A, 97 R, 97 A, 224, 241 R; 428/652, 680; 29/889.7, 889.71, 889.72, 889.721, 889.722

[56] References Cited

U.S. PATENT DOCUMENTS

| | | |
|---|---|---|
| 1,163,397 | 12/1964 | Gassmann et al. . |
| 3,038,698 | 6/1962 | Troyer . |
| 3,191,908 | 6/1965 | Powell et al. ............. 416/96 R |
| 3,619,077 | 11/1971 | Wile et al. . |
| 3,717,419 | 2/1973 | Olcott . |
| 3,834,833 | 9/1974 | Faber et al. . |
| 3,844,728 | 10/1974 | Copley et al. . |
| 4,260,327 | 4/1981 | Armor et al. . |
| 4,429,019 | 1/1984 | Schrewelius . |
| 4,573,872 | 3/1986 | Nakata . |
| 4,589,823 | 5/1986 | Koffel ...................... 416/224 |
| 4,642,027 | 2/1987 | Popp . |
| 4,677,035 | 6/1987 | Fiedler et al. ............... 415/200 |
| 4,786,233 | 11/1988 | Shizuya et al. .............. 416/96 R |
| 4,808,055 | 2/1989 | Wertz et al. ................. 416/224 |
| 5,059,095 | 10/1991 | Kushner et al. . |
| 5,071,059 | 12/1991 | Heitman et al. ............ 29/889.72 |
| 5,090,866 | 2/1992 | Blair . |
| 5,106,012 | 4/1992 | Hyzak et al. . |
| 5,116,691 | 5/1992 | Darolia et al. . |
| 5,137,422 | 8/1992 | Price et al. . |
| 5,165,852 | 11/1992 | Lee et al. .................... 416/95 |

FOREIGN PATENT DOCUMENTS 0660007 10/1951 United Kingdom ............ 416/96 R

*Primary Examiner*—Edward K. Look
*Assistant Examiner*—Christopher Verdier
*Attorney, Agent, or Firm*—Jerome C. Squillaro; Nathan D. Herkamp

[57] ABSTRACT

An airfoil for a gas turbine engine is constructed from a core body formed of a conventional nickel-based superalloy and leading and trailing edge components and squealer tip formed of a nickel aluminide alloy. The nickel aluminide components exhibit a high degree of thermal conductivity and efficiently transfer heat into the core body by direct conduction.

11 Claims, 2 Drawing Sheets

BIMETALLIC TURBINE AIRFOIL

BACKGROUND OF THE INVENTION

1. Field of the Invention

The present invention relates in general to cooling the leading and trailing edges and tips of an airfoil by conduction and relates particularly to an airfoil having a core body cast from a nickel-based superalloy and having leading and trailing edges formed of nickel aluminide bonded to the core body.

2. Description of Prior Developments

Thermal loads applied to the leading and trailing edges and tips of a gas turbine engine airfoil can adversely affect the airfoil's useful life. These thermal loads are particularly troublesome along the trailing edge region because, in order to produce an aerodynamically efficient airfoil, the trailing edge region is typically designed with a relatively thin cross section. This thin section limits the space available for efficiently removing the heat from this region using conventional convection and conduction cooling techniques.

Moreover, conventional nickel-based superalloys such as N5 and N6 usually exhibit relatively low thermal conductivity, approximately 13 BTU/Hr/Ft/F°. This low thermal conductivity also compromises the ability to efficiently cool the airfoil.

Because the heat loads applied to the pressure and suction surfaces of a gas turbine airfoil cannot always be efficiently removed by convection cooling and conduction cooling, the trailing edge of the airfoil typically experiences high operating temperatures. This can often become the limiting factor in the life of the airfoil.

Although some prior designs have bonded ceramic inserts within the hottest regions of an otherwise metallic airfoil to withstand high operating temperatures, the ceramic-to-metal bonds experience significant problems due to the high degree of differential thermal expansion across the bonds. Moreover, rather than transfer heat away from the hot regions of the airfoil, the ceramic inserts simply withstand the temperatures. Heat is not efficiently transferred from the ceramic inserts since ceramic materials exhibit low thermal conductivity values, i.e. low coefficients of heat transfer.

Even though there is generally sufficient internal space available for effectively cooling the leading edge region of an airfoil by convective cooling, the high heat loads applied on the leading edge stagnation point often produce large temperature gradients. These gradients extend between the hot leading edge of the airfoil and the cooler adjacent internal reinforcing web which defines a first cooling cavity next to the leading edge. The thermal stresses produced by these thermal gradients adversely affect the life of the airfoil.

One method of reducing a thermal gradient across a relatively small region is to transfer the heat from the region by conduction with a highly heat conductive material. Unfortunately, in the case of gas turbine engine airfoils, the currently available materials which can withstand the high operating temperatures of the hot flowing gasses and which are highly heat conductive are not as strong as the conventional nickel-based superalloys presently used to produce conventional airfoils.

For example, nickel-aluminide materials which are highly heat conductive are not by themselves presently strong enough to withstand the loads typically applied to gas turbine engine airfoils such as rotor blades and stator vanes. Even though NiAl with a K value of about 40 BTU/Hr/Ft/F° exhibits a threefold increase in heat conductivity over conventional nickel-based superalloys such as N5 and N6, NiAl is simply not strong enough to use throughout the entire airfoil.

A need therefore exists for an airfoil design which can exploit the advantages of the high heat conductivity of nickel aluminide (NiAl, NiAl$_3$) yet which can maintain the strength of conventional nickel-based superalloys over the majority of the airfoil. A particular need exists for applying the heat conducting abilities of NiAl and NiAl$_3$ to the leading and trailing edges of an airfoil where thermal loading can produce the most adverse affects oh the life of the airfoil.

SUMMARY OF THE INVENTION

The present invention has been developed to fulfill the needs noted above and therefore has as an object the provision of a conduction-cooled bimetallic airfoil such as a rotor blade or stator vane for a gas turbine engine.

Another object is to provide such an airfoil with a core body cast from a conventional single crystal nickel-based superalloy and with leading and trailing edges and "squealer tip" formed of a nickel aluminum alloy.

Another object is to reduce the thermal gradients within an operating gas turbine engine airfoil, particularly between its leading edge and an adjacent internal rib or web.

Yet another object is to reduce the weight of such an airfoil by incorporating leading and trailing edge components and a squealer tip fabricated from a light weight material such as NiAl or NiAl$_3$.

Still another object of the invention is to facilitate the fabrication and application of advanced cooling features such as internal cooling fins around the leading and trailing edges of an airfoil.

Briefly, the invention is directed to an airfoil having a cast core body formed of a single crystal nickel-based superalloy to which is bonded leading edge and trailing edge components and squealer tip formed of a highly conductive high temperature material such as nickel aluminide. By separately producing the leading and trailing edge components and tips of the airfoil and subsequently bonding these components to the core body, easy access is provided to both the interior of the core body around these regions as well as to the leading and trailing edges themselves. Because of this easy access for machining, sophisticated and complex-shaped cooling features may be incorporated inside the separately fabricated trailing edge.

The aforementioned objects, features and advantages of the invention will, in part, be pointed out with particularity, and will, in part, become obvious from the following more detailed description of the invention, taken in conjunction with the accompanying drawings, which form an integral part thereof.

BRIEF DESCRIPTION OF THE DRAWINGS

In the drawings.

In the various figures of the drawing, like reference characters designate like parts.

DETAILED DESCRIPTION OF THE PREFERRED EMBODIMENTS

Figure 1:
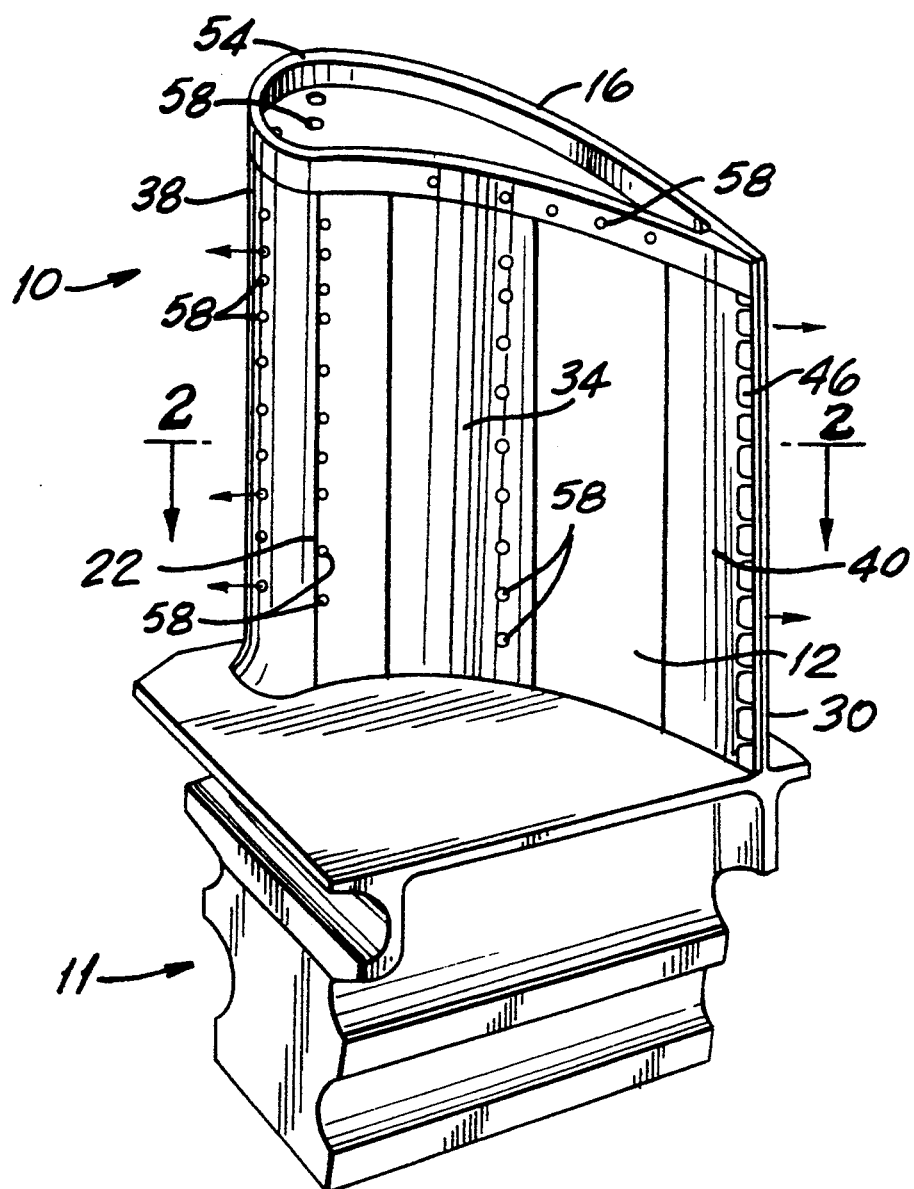
FIG. 1 is a perspective view of a gas turbine engine airfoil constructed in accordance with the invention.

The present invention will now be described in conjunction with FIGS. 1 and 2 which show an airfoil 10, such as a gas turbine engine rotor blade constructed according to the invention. Airfoil 10, which projects from a platform and base portion 11, includes a core body 12 formed of a nickel-based superalloy. Core body 12 may be cast as a single crystal from conventional materials such as N5, N6, Rene' 80 or Mar M.

The core body includes a pressure side 14 and a suction side 16 interconnected by a plurality of strengthening webs or bridges 18. A first web 20 extends across the leading end of the core body 12 and is formed with a pair of generally flat bonding surfaces 22. Additional internal webs 24 are cast within the core body to provide additional strength.

The webs 18,20,24 define a plurality of internal cooling channels 26 which may be arranged virtually the same as those depicted in U.S. patent application Ser. No. 07/912,440 filed Jul. 13, 1992, the specification of which is incorporated herein by reference. In fact, the entire airfoil structure of the present invention may be similar to that shown in U.S. patent application Ser. No. 07/912,440, except for the fabrication of the leading edge and trailing edge components discussed below.

Figure 2:
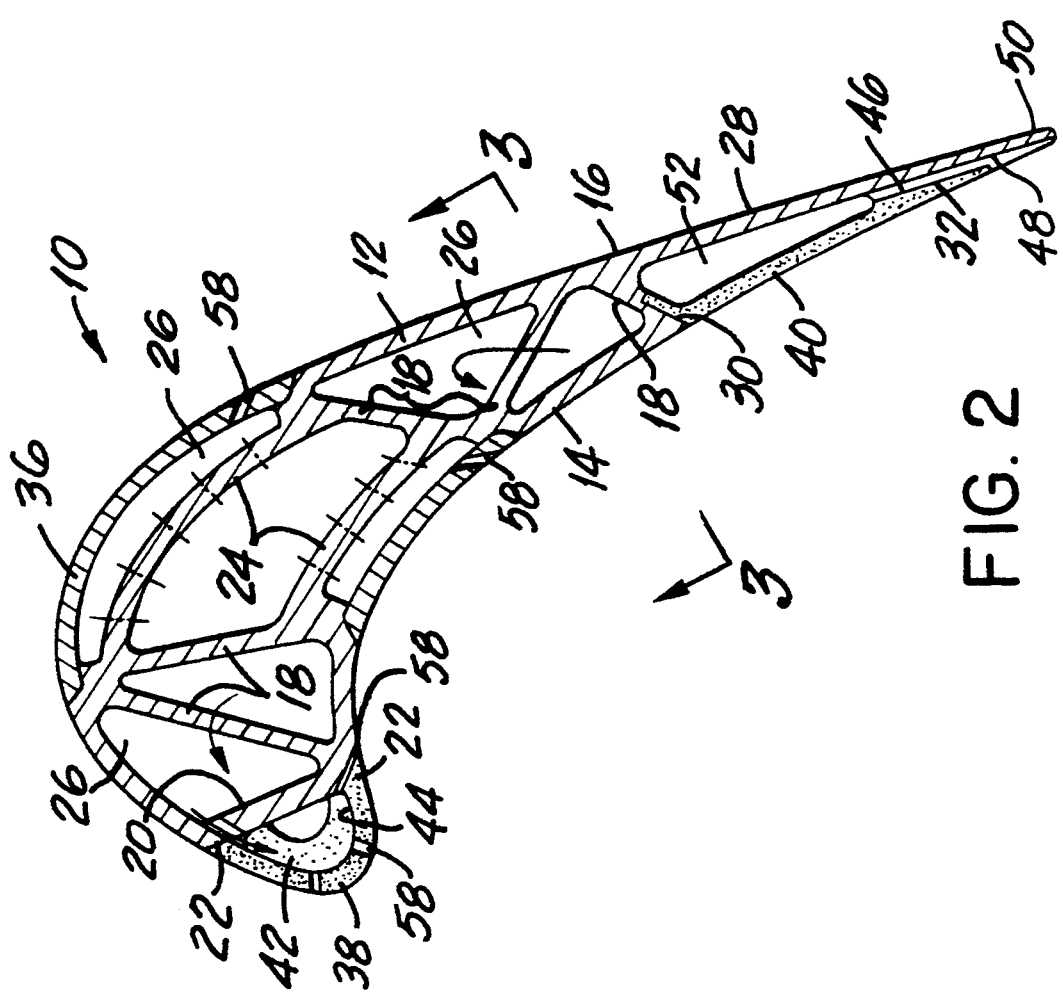
FIG. 2 is a sectional view taken along line 2—2 through the central portion of the gas turbine engine airfoil of FIG. 1.

As further seen in FIGS. 1 and 2, the core body 12 is formed with a trailing edge portion 28 which includes bonding surfaces 30,32. A first panel 34 may be bonded by brazing to the central portion of pressure side 14 of the core body and a second panel 36 may be bonded by brazing to the suction side 16 of the core body. The use of these panels facilitates the casting process. However, if multiple casting cores are assembled and used in the casting of core body 12, panels 34,36 may be cast as an integral part of airfoil 10.

A major aspect of the invention is the mounting of a fabricated leading edge component 38 and a fabricated trailing edge component 40 to the core body 12. These fabricated components are either cast or machined from a commercially available nickel aluminide alloy such as NiAl or NiAl$_3$. For example, a nickel aluminide alloy of the type disclosed in U.S. Pat. No. 5,116,691 may be used to fabricate the leading edge and trailing edge components 38,40.

Because the leading and trailing edge components are fabricated separately and apart from the core body 12, the exposed inner surfaces of these components as well as those of the core body may be readily machined with intricate cooling features such as fins, ridges, holes, passages and/or turbulators. For example, one or more cooling fins 42 may be easily formed on the interior surface 44 of the leading edge component 38 and relatively small or delicate cooling passages 46 may be machined on the inner face 48 of the trailing edge portion 28 of the core body 12 and/or on the inner face of the trailing edge component 40. These internal cooling features may be formed more accurately than that possible with one-piece homogeneously cast airfoils.

The leading edge component 38 is bonded to the core body 12 along the pair of bonding surfaces 22. A conventional single crystal brazing technique is used to firmly braze the leading edge component to the core body. Such a brazed joint provides excellent heat transfer from the leading edge component 38 to the core body 12. Because the leading edge component 38 and the core body 12 are both formed of metallic materials, thermal stresses caused by differential thermal expansion across their brazed interface are not nearly as great as those which occur across prior ceramic-to-metal bonds.

The trailing edge component 40 is bonded to the core body 12 along bonding surfaces 30,32. As with the leading edge component, a single crystal brazing operation is used to unite a nickel aluminide component to the nickel-based superalloy core body so as to provide excellent heat transfer between the trailing edge component and the core body.

Although the entire trailing edge including trailing edge portion 28 may be fabricated as a separate trailing edge component 40, it may be preferable to extend the trailing edge portion 28 of the core body along suction side 16 to the tip 50 of the trailing edge as shown in FIG. 1 so as to expose the trailing edge component 40 to the pressure side 14 only. This arrangement provides core body support to the trailing edge component along its entire length, from bonding surface 30 to a point proximate to tip 50 and defines an internal cooling cavity 52 between the trailing edge component and the core body. Cooling passages 46 vent cooling air from cavity 52 to an external flowstream.

Because the leading edge and trailing edge components 38,40 typically have about two-thirds the density of the core body 12, a weight reduction can be realized as compared to prior airfoils formed from homogeneous superalloy castings. The bimetallic airfoil of FIG. 1 not only reduces the overall weight of the blade but it also reduces the stresses produced during blade rotation caused by centrifugal force.

Moreover, because the leading edge and trailing edge components efficiently transfer heat across the brazed joints and into the core body, less cooling air is needed to cool these components. This, in turn, produces an improvement in the overall efficiency of the gas turbine engine as less bypass air is needed for cooling purposes.

Figure 3:
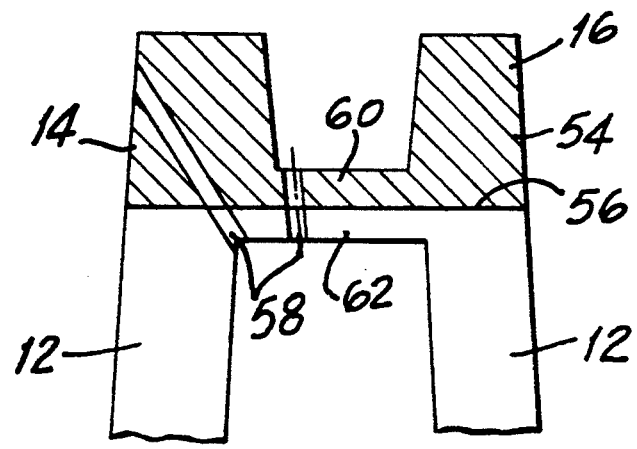
FIG. 3 is a partial sectional view taken along line 3—3 of FIG. 2.

As seen in FIGS. 1 and 3, a blade tip portion 54, formed of a nickel aluminide alloy of the same or similar material used to form the leading edge and trailing edge components 38,40 is bonded to the roof 62 of core body 12 along bonding surface 56, as shown in FIG. 3, with a single crystal brazing technique. Blade tip 54, known as a "squealer tip" provides highly efficient conductive cooling to the hot blade tip in the same manner as that provided by the leading edge and trailing edge components 38,40.

Film cooling holes 58 may be formed through the base 60 of the blade tip 54 and the roof 62 of core body 12 as well as through the pressure side 14 of the blade tip and the roof of core body 12. Additional film cooling holes 58 may be formed through the leading edge and trailing edge components 38,40 as well as through the first and second panels 34,36.

There has been disclosed heretofore the best embodiment of the invention presently contemplated. However, it is to be understood that various changes and modifications may be made thereto without departing from the spirit of the invention.

For example, only the leading edge component or the trailing edge component may be bonded to the core body, as long as at least one such edge component is present in the airfoil assembly.

What is claimed is:

1. An airfoil for a gas turbine engine, comprising:
a core body formed of a nickel-based superalloy;

a leading edge component formed of a nickel aluminide alloy; and a trailing edge component formed of a nickel aluminide alloy;

wherein said leading edge component and said trailing edge component are fabricated separately and apart from said core body and from one another and wherein each of said leading edge and trailing edge components is subsequently bonded to said core body.

2. The airfoil of claim 1, wherein said core body comprises a single crystal casting.

3. The airfoil of claim 2, wherein said leading edge component and said trailing edge component are each bonded to said core body by a single crystal brazed joint.

4. The airfoil of claim 1, wherein said core body comprises a trailing edge portion which defines a trailing edge tip and wherein said trailing edge component is bonded to said trailing edge portion proximate to said tip.

5. The airfoil of claim 4, wherein said trailing edge component defines at least in part an internal cavity within said airfoil and a cooling passage extending from said internal cavity to said tip.

6. The airfoil of claim 1, wherein said leading edge component comprises an internal surface portion having cooling means formed thereon.

7. The airfoil of claim 6, wherein said cooling means comprises a cooling fin.

8. The airfoil of claim 1, further comprising a tip portion formed of a nickel aluminide alloy, said tip portion being fabricated separately and apart from said core body and subsequently bonded to said core body.

9. A bimetallic airfoil, comprising:

a core body formed from a single crystal nickel-based superalloy casting; and a fabricated trailing edge component comprising a nickel aluminide alloy, said fabricated trailing edge component being fabricated separately and apart from said core body and subsequently mounted to said core body by a single crystal brazed joint.

10. A bimetallic airfoil, comprising:

a core body formed from a single crystal nickel-based superalloy casting; and a fabricated leading edge component comprising a nickel aluminide alloy, said fabricated leading edge component being fabricated separately and apart from said core body and subsequently mounted to said core body by a single crystal brazed joint.

11. An airfoil for a gas turbine engine having a pressure side and a suction side, comprising:

a core body formed of a nickel-based superalloy, which includes a trailing edge portion disposed on said suction side which defines a trailing edge tip;

a leading edge component formed of a nickel aluminide alloy and bonded to said core body; and a trailing edge component formed of a nickel aluminide alloy and bonded to said trailing edge portion proximate to said tip and disposed on said pressure side.

* * * * *